United States Patent
Jha et al.

(10) Patent No.: US 10,192,746 B1
(45) Date of Patent: Jan. 29, 2019

(54) STI INNER SPACER TO MITIGATE SDB LOADING

(71) Applicant: GLOBALFOUNDRIES, Inc., George Town (KY)

(72) Inventors: Ashish Kumar Jha, Saratoga Springs, NY (US); Hui Zhan, Clifton Park, NY (US); Hong Yu, Rexford, NY (US); Zhenyu Hu, Clifton Park, NY (US); Haiting Wang, Clifton Park, NY (US); Edward Reis, Ballston Spa, NY (US); Charles Vanleuvan, East Northport, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 15/665,183

(22) Filed: Jul. 31, 2017

(51) Int. Cl.
| | |
|---|---|
| H01L 21/76 | (2006.01) |
| H01L 21/28 | (2006.01) |
| H01L 21/762 | (2006.01) |
| H01L 21/8234 | (2006.01) |
| H01L 21/475 | (2006.01) |

(52) U.S. Cl.
CPC ...... H01L 21/28123 (2013.01); H01L 21/475 (2013.01); H01L 21/76232 (2013.01); H01L 21/823431 (2013.01)

(58) Field of Classification Search
None
See application file for complete search history.

(56) References Cited

U.S. PATENT DOCUMENTS

| | | | | |
|---|---|---|---|---|
| 6,265,302 | B1* | 7/2001 | Lim | H01L 21/76232 257/E21.507 |
| 2009/0068817 | A1* | 3/2009 | Eun | H01L 21/76232 438/425 |
| 2010/0167496 | A1* | 7/2010 | Koo | H01L 21/76232 438/437 |
| 2015/0295005 | A1* | 10/2015 | Tseng | H01L 27/14638 257/446 |

* cited by examiner

*Primary Examiner* — Thien F Tran (57) ABSTRACT

A shallow trench isolation (STI) structure is formed from a conventional STI trench structure formed of first dielectric material extending into the substrate. The conventional STI structure undergoes further processing, including removing a first portion of the dielectric material and adjacent portions of the semiconductor substrate to create a first recess, and then removing another portion of the dielectric material to create a second recess in just the dielectric material. A nitride layer is formed above remaining dielectric material and on the sidewalls of the substrate. A second dielectric material is formed on the spacer layer and fills the remainder of first and second recesses. The nitride layer provides an "inner spacer" between the first insulating material and the second insulating material and also separates the substrate from the second insulating material. An isotropic Fin reveal process is performed and the STI structure assists in equalizing fin heights and increasing active S/D region area/volume.

14 Claims, 12 Drawing Sheets

STI INNER SPACER TO MITIGATE SDB LOADING

TECHNICAL FIELD

The present disclosure relates generally to the manufacture of semiconductor devices, and more particularly, to the fabrication and manufacture of a novel shallow trench isolation (STI) process and structure for use with field-effect transistor (FET) type structures.

BACKGROUND

Single diffusion break (SDB) devices are becoming more desirable due to their improved performance capabilities. However, the present performance of such devices is mainly affected by the resulting shape of the epi source/drain regions. This shape impacts contact resistance, device drive current and leakage current.

Figure 1A:
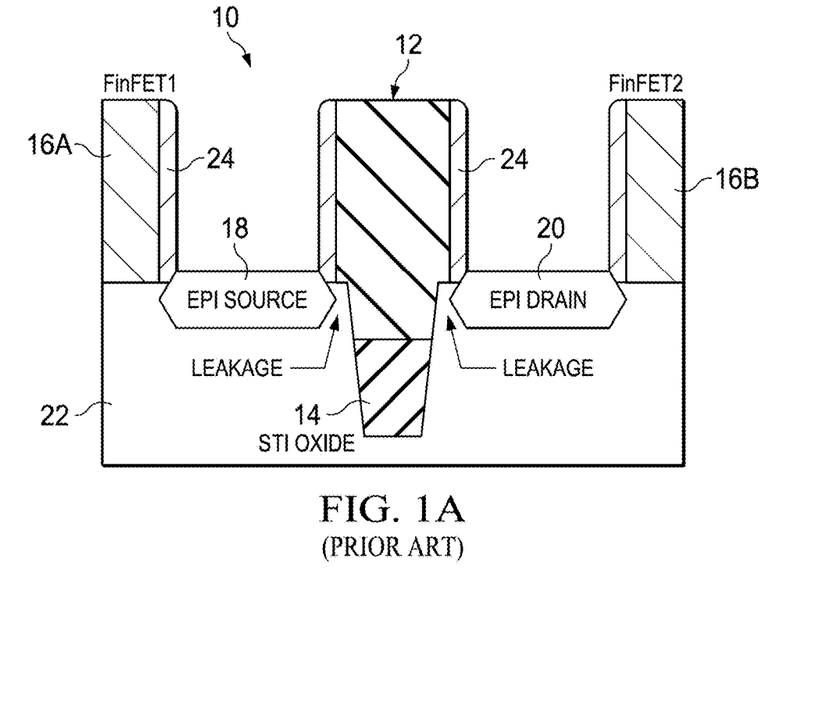
FIGS. 1A and 1B illustrate a cross-sectional view of two FinFET-type semiconductor devices in accordance with the prior art.

As shown in FIG. 1A, a prior art device 10 includes a dummy gate 12 covering a shallow isolation trench 14 between a pair of neighboring FinFETs 16A, 16B (each only partially shown) providing a single diffusion break. Prior art device 10 is also shown with an epitaxial source/drain (S/D) region 18 (for FET 16A) and S/D region 20 (for FET 16B) formed within a substrate 22. Spacers 24 are formed along FinFETs 16A, 16B and the dummy gate 12.

Figure 1B:
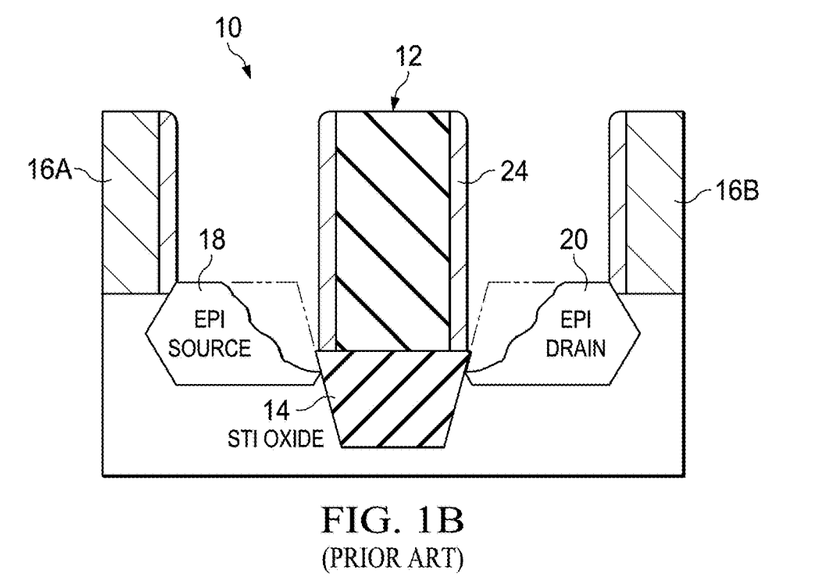

However, patterning for the shallow isolation trench 14 is difficult at small dimensions using conventional lithography and etch techniques presently available. The prior art device 10 may suffer from leakage between the S/D through the dummy gate 12. Also, as shown in FIG. 1B, after cavity etching, the epitaxy (epi) of the S/D regions 18, 20 grows non-ideally resulting in asymmetric growth and a shape that degrades performance. This growth typically results in a slanted epi S/D region slanting downward toward the isolation trench 14 because there is little (if any) substrate 22 available for growth adjacent the isolation trench 14. Because of the small dimensions, the cavity etch for the S/D regions etches away most of the substrate 22 near the isolation trench 14. In addition, the device 10 still provides a potential leakage path through the dummy gate 12.

To alleviate some of these issues, a different trench isolation structure (and methods of manufacture/fabrication) has been proposed that enables a growth of more uniform epitaxial S/D regions to improve active device performance. Such structure and methods for manufacture/fabrication are detailed in U.S. patent application Ser. No. 15/195,988 entitled "Novel STI Process For SDB Devices" and filed on Jun. 28, 2016. One purpose or benefit of the structure(s) and process(es) described in that US patent application is to protect from, or reduce, silicon loss in the SDB structure during epitaxial cavity etch next to the STI region.

In addition to the foregoing issues of the prior art SDB FinFET device(s), when both SDB FinFET devices and double diffusion break (DDB) FinFET devices are fabricated on the same chip, it is desirable to match closely the Fin heights of the two types of devices. When utilizing an anisotropic etching process (or at least partially anisotropic process) for the Fin reveal process, including a two-step process such as etching and chemical oxide removal (COR), this results in a relatively wide recess in the silicon (and the Fin is recessed at the edges), a taller raised STI region, and shorter Fin height (silicon loss from top of fin, e.g., on order of 10 nm) and rounded Fin top.

The wider silicon recess and raised STI height degrade the aspect ratio (AR) in the SDB structure. In addition, the recessed edges of the Fin structure may result in big facets in the source/drain (S/D) region, thereby causing a weaker junction and contact landing problems. Having a short Fin height leads to weaker device performance, and may cause problems when seeking to match Fin heights between SDB structures and DDB structures.

Accordingly, there is a need for a new trench isolation structure (and methods of manufacture/fabrication) that reduces S/D facets and AR degradation in SDB structures. Reducing S/D facets and improving AR in SDB structures can be accomplished by smaller silicon recess widths, shorter raised STI heights, increased Fin heights and/or flatter Fin tops, thereby resulting in improved device performance.

SUMMARY

In accordance with one advantageous embodiment, there is provided a semiconductor device having a semiconductor substrate and a shallow trench isolation (STI) structure disposed within the semiconductor substrate. The STI structure includes a first STI layer disposed in the substrate, a second STI layer disposed above the first STI layer, and a third STI layer disposed within the substrate and above the second STI layer. The second STI layer includes a first lower layer disposed above the first STI layer, a first vertical layer disposed along a first vertical sidewall of the substrate, and a second vertical layer disposed along a second vertical sidewall of the substrate. The device further includes a field effect transistor (FET) disposed on the semiconductor substrate and having a first gate structure, an epitaxial first source/drain (S/D) region, and an epitaxial second S/D region, wherein the epitaxial first S/D region is disposed adjacent to the STI structure.

In another embodiment, there is provided a method of manufacturing or fabricating a semiconductor device for use with one or more field-effect transistor (FinFET) devices. The method includes forming a shallow trench isolation (STI) structure within a semiconductor substrate from a shallow trench of first insulating material. The STI structure is formed by: forming a mask layer to selectively expose the first insulating material and adjacent portions of the semiconductor substrate; removing a first portion of the first insulating material and the substrate using the mask layer to form a first recess in the substrate having a first depth and expose vertical sidewall portions of the substrate; removing a second portion of the first insulating material using a chemical oxide removal process, thereby forming a second recess having a second depth wherein a third portion of the first insulating material remains; forming an inner spacer layer on the third portion of the first insulating material and along the exposed vertical sidewalls of the substrate; and forming a layer of second insulating material on the inner spacer layer and filling the first and second recesses with the second insulating material, thereby forming the STI structure comprising a lower portion of first insulating material and an upper portion of second insulating material separated by the inner spacer layer, and wherein portions of the inner spacer layer are disposed adjacent the vertical sidewall portions of the substrate.

In yet another embodiment, there is provided a method of fabricating a semiconductor device for use with one or more field-effect transistor (FET) devices. The method includes forming a shallow trench isolation (STI) structure from a shallow trench of first insulating material within a semiconductor substrate. The STI structure is created by: forming a mask layer to selectively expose a surface of the first insulating material and surfaces of adjacent portions of the semiconductor substrate; selectively removing a first portion the exposed first insulating material and the exposed semiconductor substrate to a first depth, thereby exposing a second portion of the first insulating material and forming exposed vertical sidewalls in the semiconductor substrate; selectively removing another portion of the exposed second portion of first insulating material to a second depth, thereby exposing a third portion of the first insulating material; and forming a spacer layer on the exposed third portion of insulating material and on the exposed vertical sidewalls of the semiconductor substrate; and forming a layer of second insulating material layer on the spacer layer. The method of fabricating further includes forming a first field effect transistor (FET) on the substrate, the first FET having a gate structure, a first source/drain (S/D) region and a second S/D region, wherein the first S/D region is formed adjacent to the STI structure.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

The present disclosure describes a novel STI structure (and method of forming) for use with FET-type semiconductor devices. The STI structure includes a conventional trench structure formed of dielectric material extending into the substrate. A portion of the dielectric material and the substrate is removed leaving a shallow recess below the substrate surface, and then a portion of the exposed dielectric material is removed forming a deeper recess into the trench structure. A layer of nitride is formed on the trench structure and along the walls of the exposed substrate. This is referred to as an "inner spacer". A planarizing layer fills the remaining recess. After further conventional processing, the STI structure is substantially formed within the substrate with a nitride layer (inner spacer) surrounding an upper portion of the dielectric material and isolating the upper portion from both the lower portion and the substrate. A portion of nitride layer results in a structure that extends outward beyond the outer edges of the underlying STI structure—creating a buffer structure between the dielectric material and the substrate. Thereafter, other structures are conventionally formed on the substrate (e.g., dummy structures, active gates, S/D regions, contacts, etc.) are formed to construct the FinFET devices. The placement and configuration of the nitride layer assists in reducing STI height compared to the substrate surface. Additionally, when both SDB structures and DDB structures are constructed on the substrate, it is desirable to have the Fin heights for both types of structures equal. Switching to a Fin reveal process that is isotropic (and preferably a single stage process) not only assists in matching fin height more closely, but also provides smaller silicon recess, which provides a larger area/volume for the eventual formation of the S/D regions.

FIGS. 2 through 7 and the various embodiments used to describe the principles of the present disclosure in this patent document are by way of illustration only and should not be construed in any way to limit its scope. Those skilled in the art will understand that the principles described herein may be implemented in any type of suitably arranged FET device.

To simplify the drawings, reference numerals from previous drawings will sometimes not be repeated for structures that have already been identified.

Figure 2:
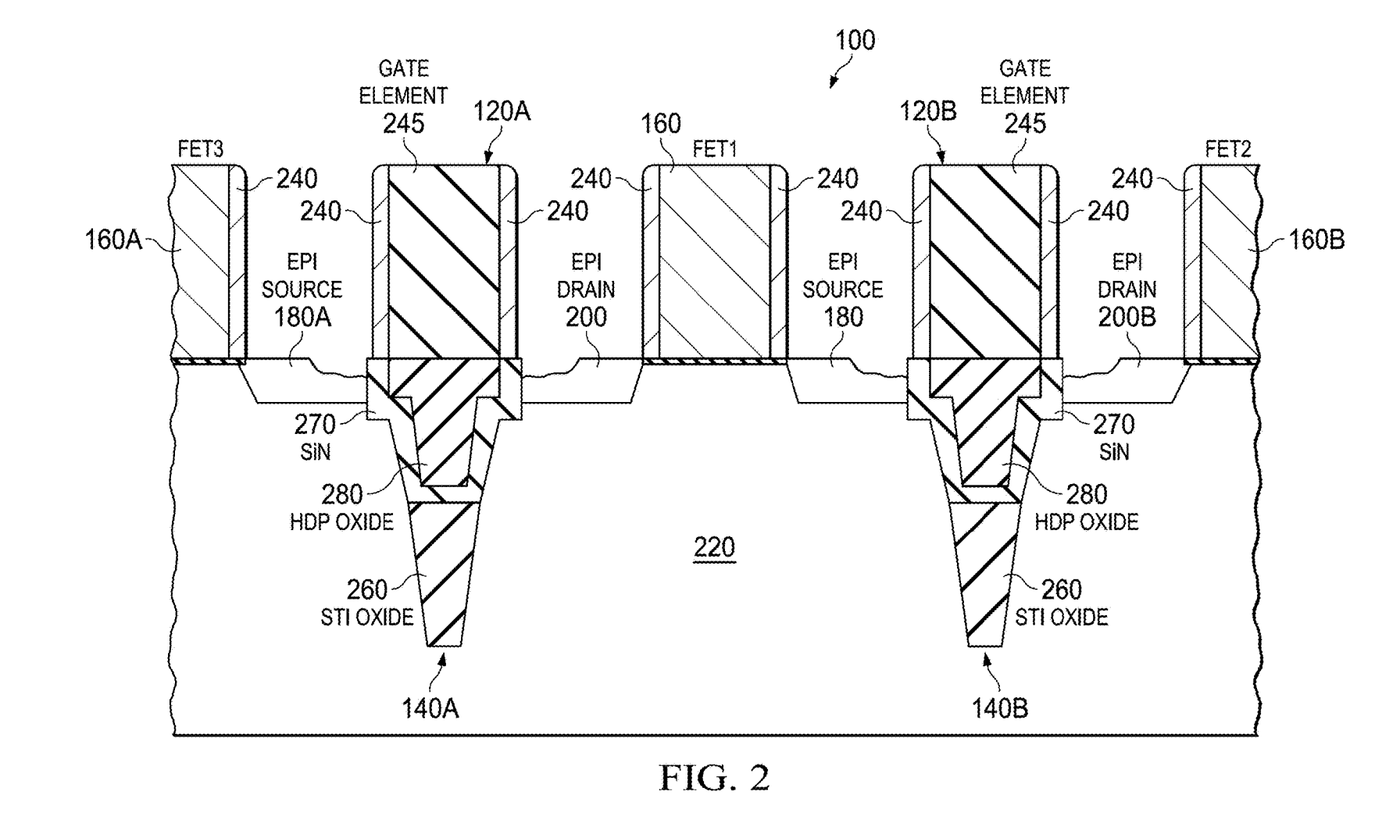
FIG. 2 illustrates a cross-sectional view of three FinFET-type semiconductor devices in accordance with the present disclosure.

Now turning to FIG. 2, there is shown a semiconductor device 100 having a semiconductor substrate 220 and including a pair of dummy gates 120A, 120B disposed above a pair of shallow trench isolation (STI) structures 140A, 140B each providing a single diffusion break. As will be appreciated, the dummy gates 120A, 120B could be formed of other suitable material(s). A FinFET device 160 is disposed between the STI structures 140A, 140B which provide isolation for the FinFET device 160. Also shown is a pair of neighboring FinFETS 160A and 160B (each only partially shown). The FinFET 160 is shown with epitaxial source/drain (S/D) regions 180, 200 formed in the substrate 220. Similarly, although only partially shown, the FinFETs 160A, 160B each have two epitaxial S/D regions (and only source region 180A and drain region 200B are shown). Further, only the relevant portions of the FinFET devices 160, 160A, 160B are shown, and the source and drain contacts (and actual gate contacts) are not illustrated.

It will also be understood that, depending on the type of FET device desired, S/D regions 180, 200 will be doped with either n-type or p-type impurities, while their corresponding channel regions (in the substrate 220) may be doped with the opposite type—either p-type or n-type (or no type), respectively.

For ease of reference, the following description will be in reference to the STI structure 140A (disposed between and isolating the FinFET 160 from the FinFET 160A) and its associated dummy gate structure 120A. The STI structure 140A includes an STI oxide structure/layer or other insulating material 260 (lower portion). A protective layer of nitride 270 is disposed above the STI oxide structure 260 and extends (laterally) beyond the outer edge(s) of the STI oxide structure 260 as shown (see also, FIG. 7). The STI structure 140A also includes an upper STI oxide structure/layer or other insulating material 280 (upper portion).

In one embodiment, the protective nitride layer 270 separates the upper portion 280 from the lower portion 260 and forms a vertical sidewall between the upper portion 280 and the substrate 220. This results in the nitride layer 270 providing a vertical wall between the upper portion 280 and the substrate 220. Typically, the height of the vertical sidewall between the upper portion 280 and the substrate 220 should be similar to, or approximately, or on the order of, the desired or resulting Fin height(s) (after Fin reveal process) for the semiconductor process and technology utilized. However, other heights may be desirable.

The dummy gate structure 120A includes sidewall spacers 240 and a gate element 245. The gate element 245 may be formed of any suitable insulating material, and may be formed of conductive material such as polysilicon. As will be appreciated, this structure 120A will be similar in configuration on the STI structure 140A near the drain region 200 (and will be similar for the other STI structure 140B). In other embodiments, the dummy gate structure(s) 120A, 120B, may be constructed of different material(s) and layer(s).

FIGS. 3 through 8 are diagrams that illustrate a series of relevant steps of one embodiment of a method or process for manufacturing the semiconductor device 100, including the FinFET devices 160, 160A, 160B (shown in FIG. 2).

Figure 3:
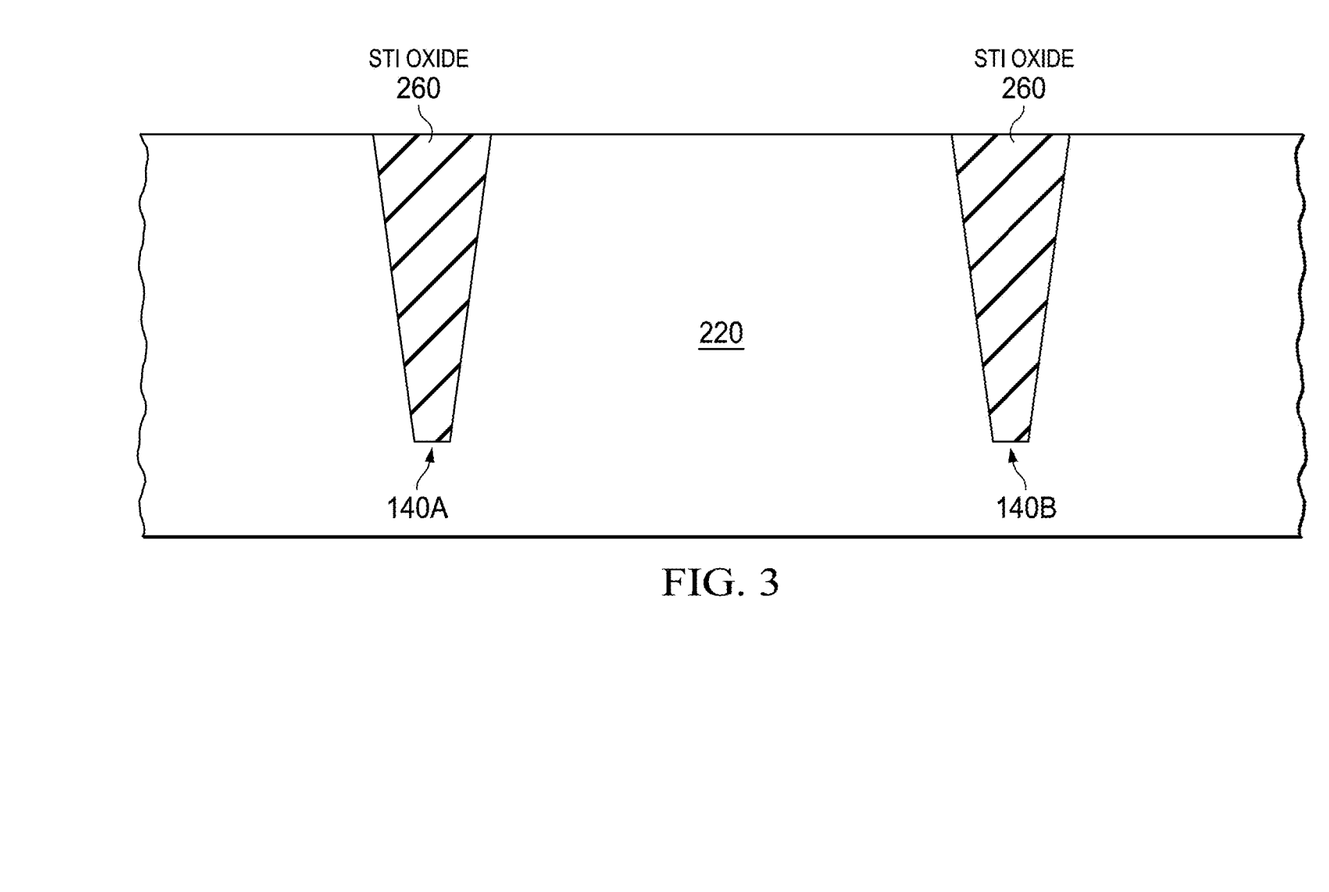
FIGS. 3, 4A, 4B, 5A, 5B, 6A, 6B, 6C and 6D, and 7 are diagrams that illustrate a series of steps of one embodiment of a method or process for manufacturing the FinFET-type devices shown in FIG. 2.

Now turning to FIG. 3, the semiconductor substrate 220 is provided and formed with STI structures 260 disposed therein. To form the structure shown in FIG. 3, a mask (not shown) formed above the substrate 220 is used with an etching/removal process that selectively removes portion(s) of substrate at the desired location(s) to form "shallow" trenches. Any suitable mask material may be used (e.g., nitride, oxide/nitride stack, photoresist material, etc.). The trenches are filled with material using a suitable process to form the STI oxide structures 260 of the STI structures 140A, 140B, and if necessary, planarization and mask removal occurs—resulting in the structure shown in FIG. 3.

The substrate 220 may be any suitable substrate material, such as bulk or epitaxially grown semiconductor material (e.g., silicon, silicon compounds) or silicon-on-insulator (SOI). The STI oxide structures 260 may be formed of any suitable material providing insulating and/or isolating functions, such as silicon oxide. Though not shown in FIG. 3, a thin layer of oxide may be formed within the trenches prior to formation of the STI oxide structures 260.

Figure 4A:
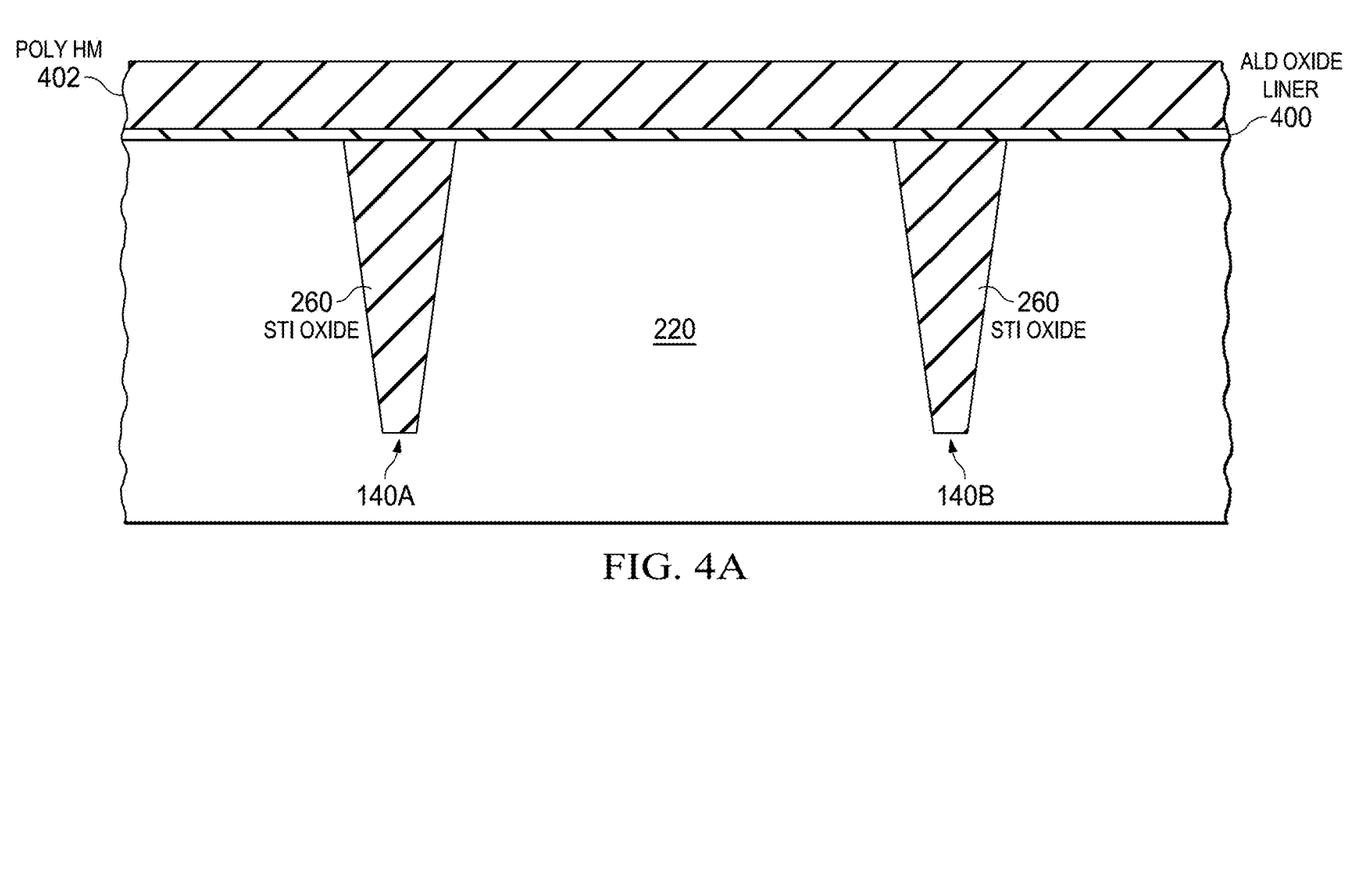

Now turning to FIG. 4A, the structure shown in FIG. 3 undergoes a deposition process which adds two layers to the substrate 220. An atomic layer deposition (ALD) of an oxide layer 400 is formed on the substrate 220, as shown. Any suitable oxide layer and formation process may be used. In one embodiment, the oxide layer 400 may be in the range of 1-5 nanometers thick, and more preferably between about 1-2 nm. Optionally, a cleaning step may be performed, such as DHF clean, prior to formation of the oxide layer 400. Next, a hard mask layer 402 is formed above the oxide layer 400. Although suitable material(s) may be utilized, in one specific embodiment, the hard mask (HM) layer 402 is formed of polysilicon, and on the order of 20-60 nanometers in thickness, and preferably around 40 nm.

After the oxide layer 400 and HM layer 402 are formed, a mask layer 404 (of suitable material) is formed with openings coincident with the STI structures, yet wider in area, which exposes the selected portions. The mask layer 404 selectively opens/exposes a wider portion above the STI oxide structures 260, as shown in FIG. 4B.

Figure 4B:
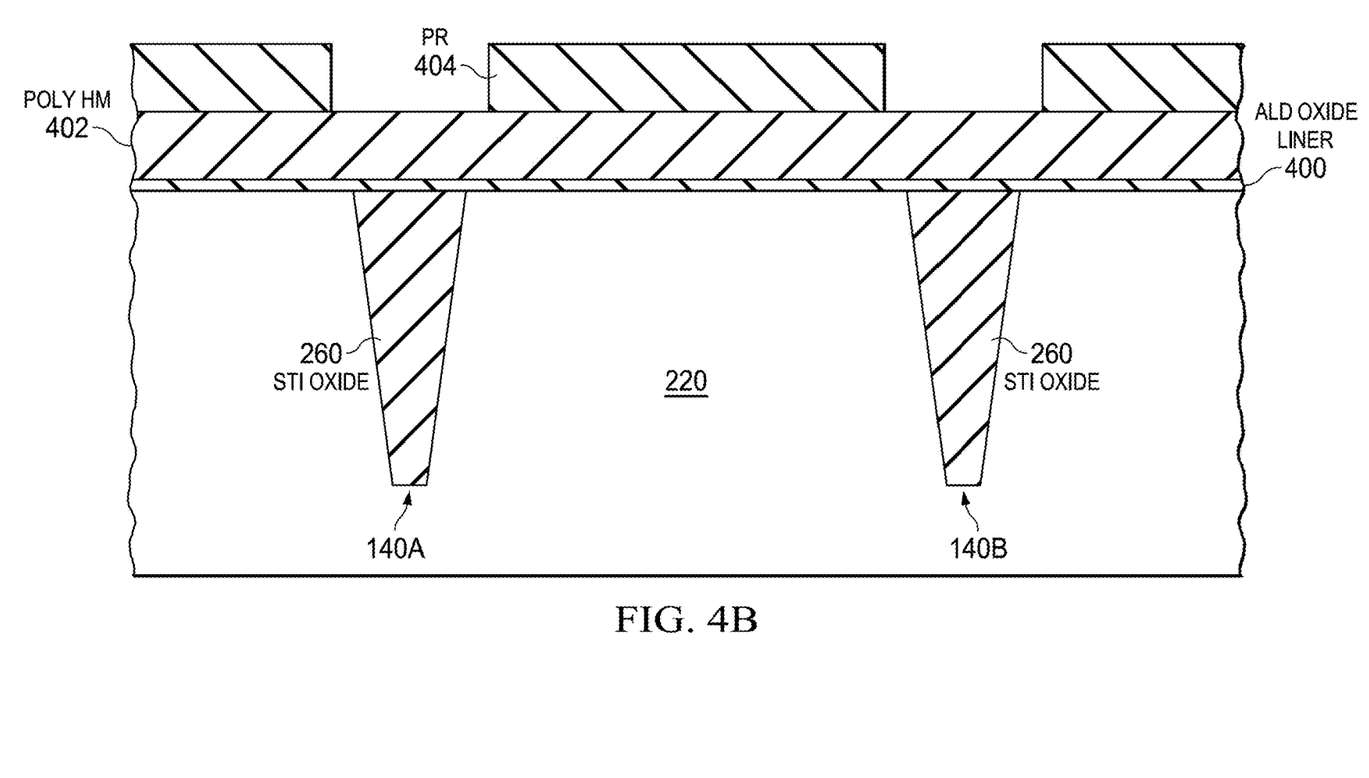
Figure 5A:
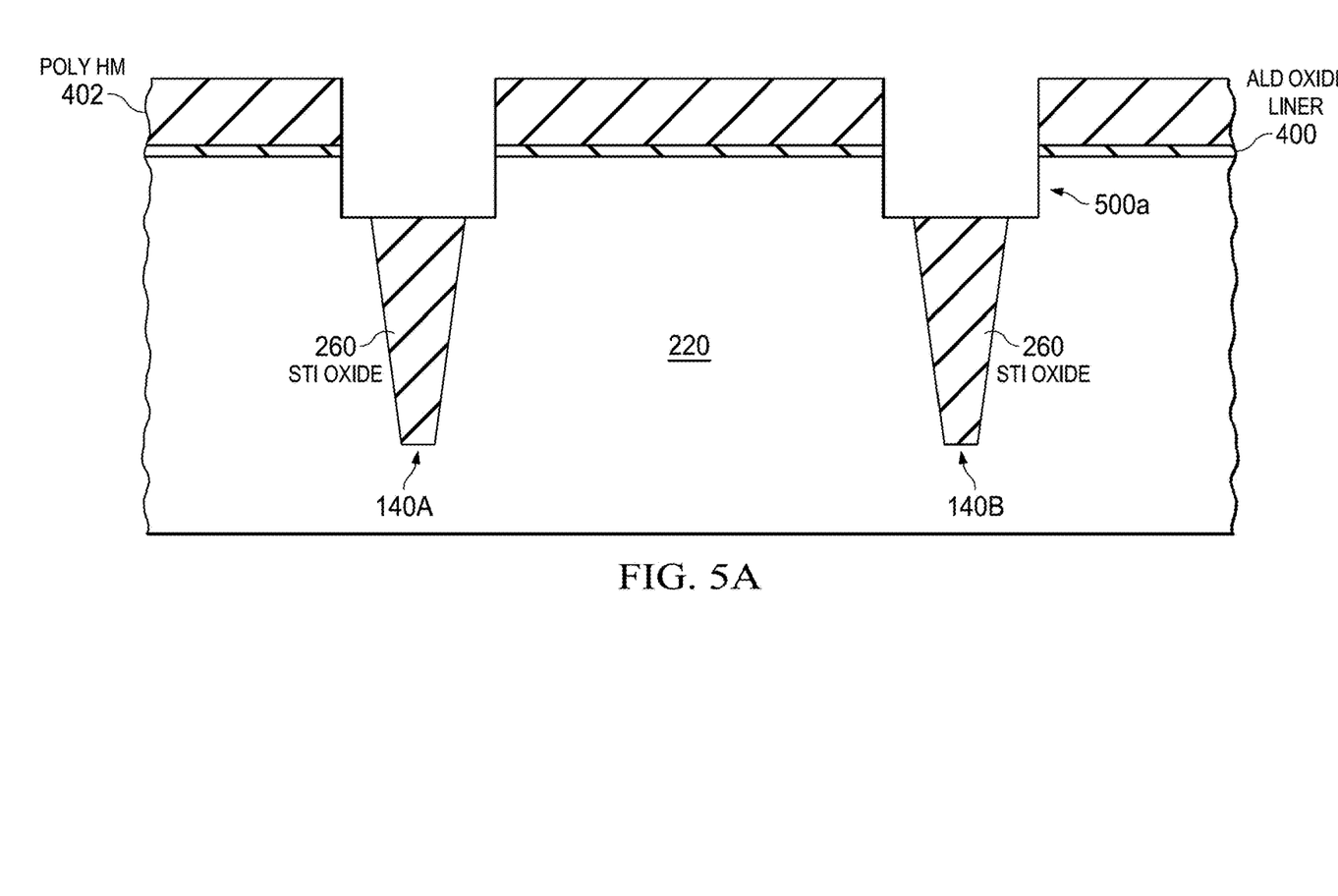
Figure 5B:
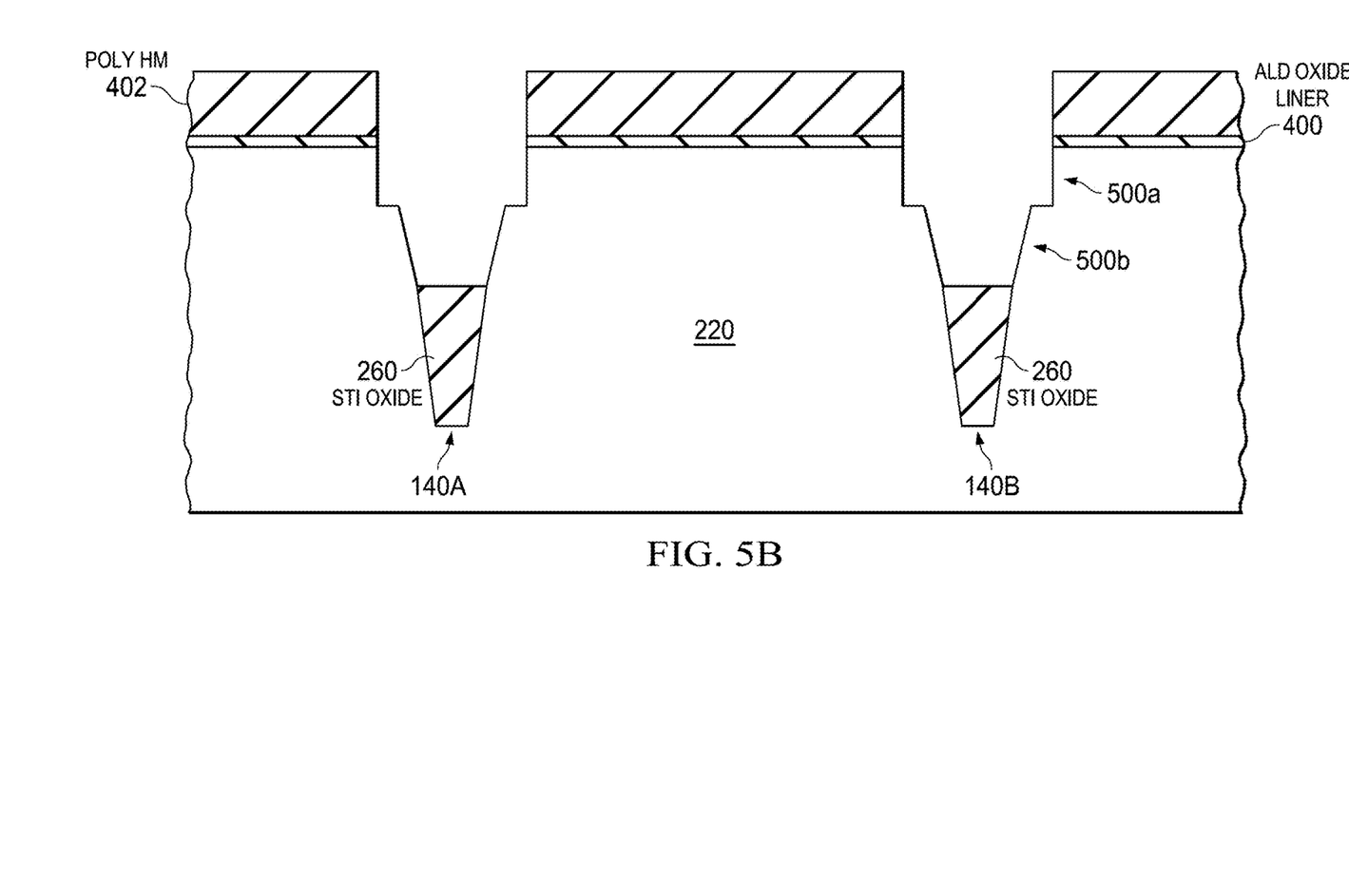

Now turning to FIG. 5A, the structure shown in FIG. 4B undergoes a removal process wherein the exposed portions of the HM layer 404, the oxide layer 402, the substrate 220 and a first, top portion of the STI oxide structures 260 are etched/removed—leaving a first recess 500a (a wider valley) formed above the structures 260 and into the substrate 220—as shown in FIG. 5A (shown with the mask layer 404 removed). The HM, oxide and silicon removal/etch process may include any suitable processing, and may be an integrated RIE process (e.g., HM etch selective to oxide, and non-selective etch for oxide and silicon at the same rate). The structure now shown in FIG. 5A undergoes another removal process wherein a second portion of the remaining STI oxide structures 260 are etched/removed—leaving a second recess 500b (a deeper valley) within the structures 260 and into the substrate 220—as shown in FIG. 5B. This STI removal process may be an isotropic dry etch, or other suitable process that does not remove silicon. After the second recess 500b is formed, an optional thin oxide growth/deposition step may be performed to form a thin layer (or liner) of oxide within the recess 500. Such optional oxide layer may be on the order of 1-2 nanometers thick.

Figure 6A:
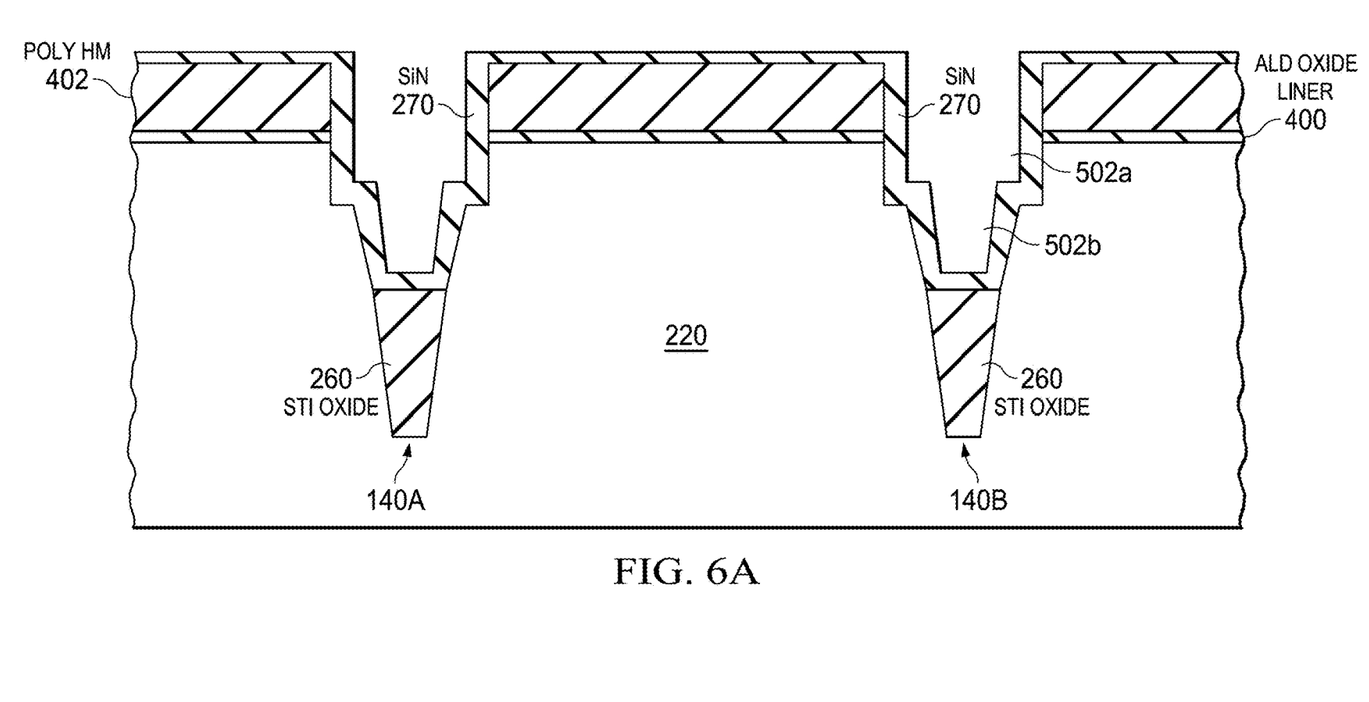

Now turning to FIG. 6A, the structure shown in FIG. 5B undergoes a deposition process in which the layer 270 is formed above the STI trenches, along surfaces of the exposed portion(s) of the substrate 220 (vertical sidewalls, angled sidewalls, etc.) and the other layers 400, 402—as shown. The layer 270 may be any suitable material, and preferably is a material that resists a later formation/etching/removal process that will occur during formation of the epitaxial S/D regions. In one embodiment, the layer 270 is formed of nitride, and particularly silicon nitride. In other embodiments, the layer 270 has a thickness in the range of about 2 to 7 nanometers (nm), and in another embodiment is about 4 nm. Once the layer 270 is formed—as shown in FIG. 6A—the resulting structure includes a trench 502 having a wider, shallower portion above a narrower, deeper portion (portions depicted by reference numerals 502a, 502b) above the STI oxide structures 260.

Figure 6B:
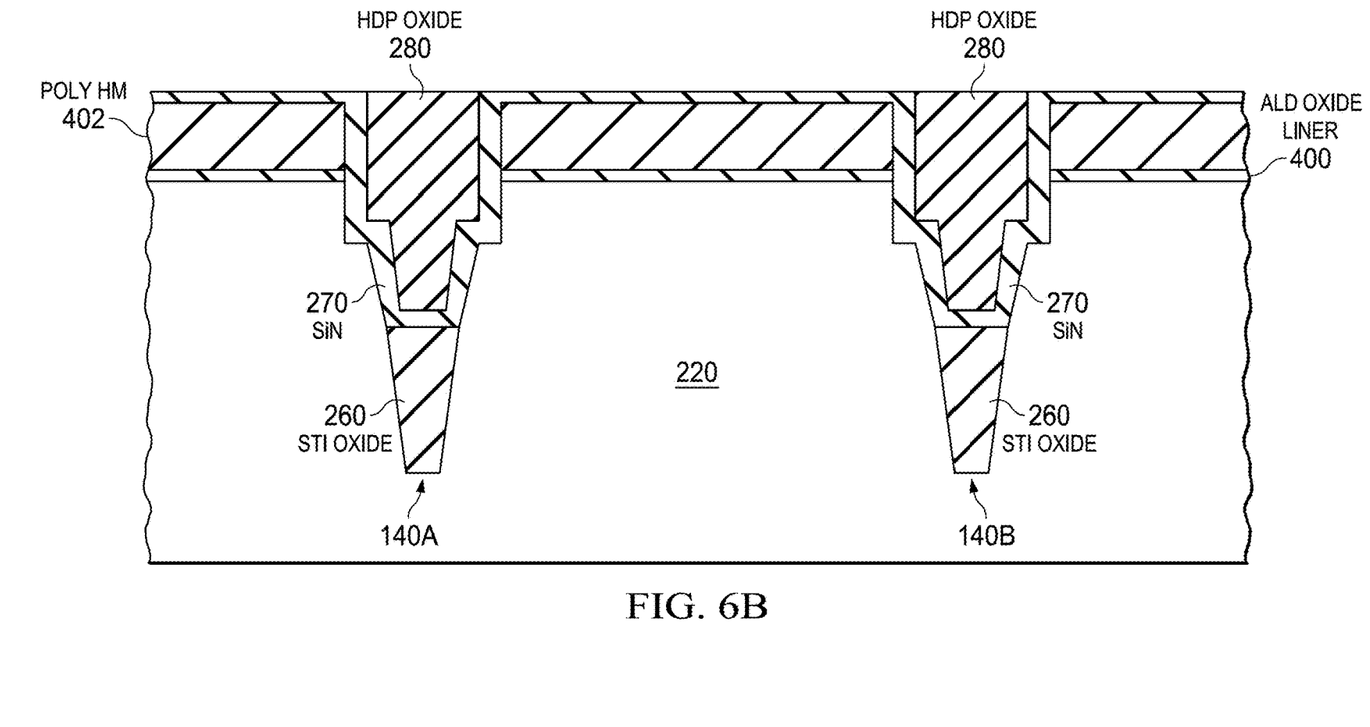

Now turning to FIG. 6B, the structure shown in FIG. 6A undergoes a fill and planarization process that fills the remaining portions 502a, 502b of trench 502 with insulating material and planarizes the structure. A suitable insulating layer or material 280, such as oxide, is formed or deposited in the trench 502 and above the layer 270. Any suitable deposition process may utilized, such as high density plasma (HDP) deposition process. The structure is then planarized, using a suitable planarization process, such as by chemical-mechanical polishing (CMP), with a stop on the layer 270.

The structure shown in FIG. 6B undergoes further processing that removes the top layer 270 (with a stop on the HM 402) and removes the HM 402 (with a stop on oxide layer 400). These two layers may be removed by any suitable removal/etch/strip process. The resulting structure is illustrated in FIG. 6C.

Figure 6C:
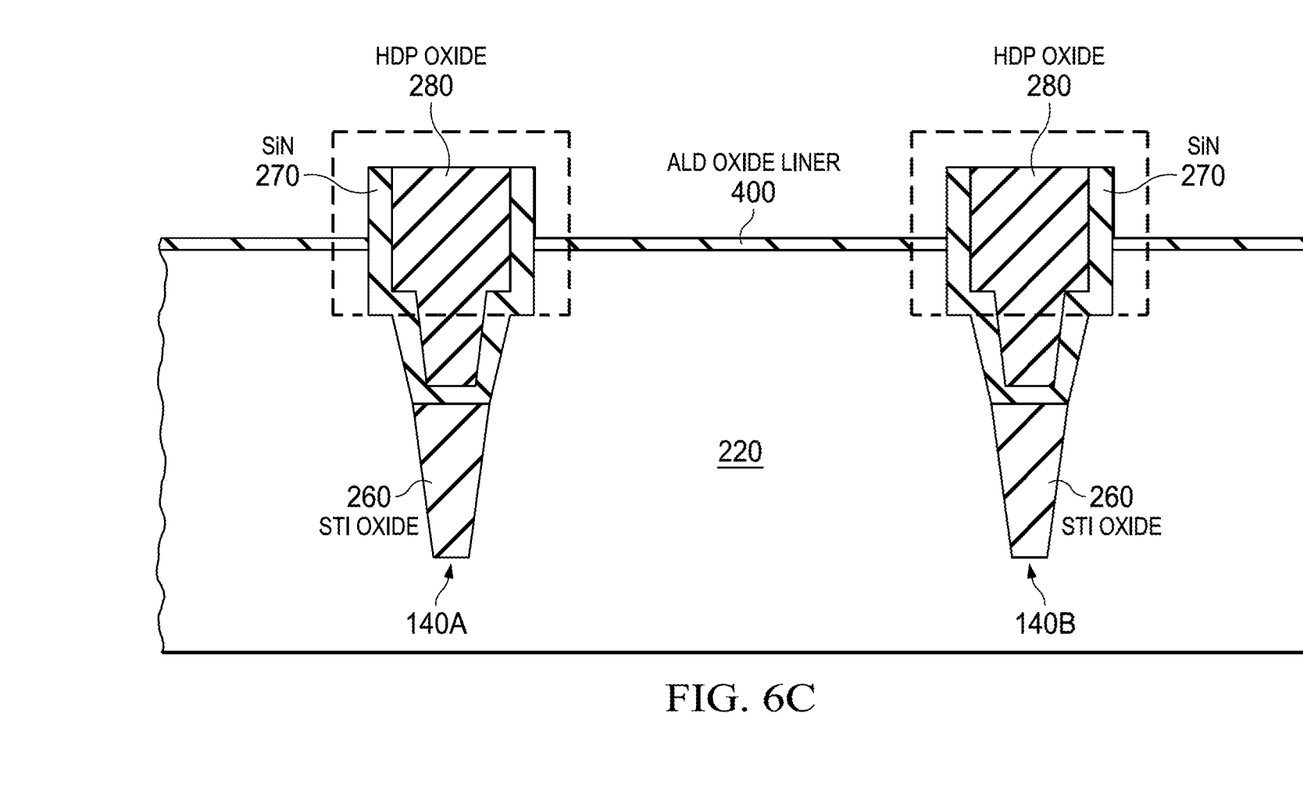

FIG. 6C illustrates in dotted lines the profile of the prior art STI structure as it would exist if prior art processing were performed. As shown, using the process(es) described herein, the height of the STI structure (prior to fin reveal) is shorter, while the width of the STI structure is smaller. Enabling a smaller width increases the spacing between two adjacent STI structures, thus increasing the area/volume of substrate material 220 available for S/D region formation (e.g., between the two STI structures). This results in the presence of a larger active silicon area/volume during a later epitaxial process that grows/forms the S/D regions, and increases the effective active S/D region area/volume, e.g., a more complete S/D region is formed (see also, FIG. 2).

Although not shown, a Fin reveal process occurs on the structure shown in FIG. 6C that forms/reveals the fin structures (not shown in the FIGUREs), removes the oxide layer 400, and removes a portion of the oxide 280 (leaving some of the layer 270 above the surface of the substrate 220, not shown).

Although any suitable process(es) may be utilized for the fin reveal process, in one embodiment, the Fin reveal process involves performing only isotropic material removal (single stage or multiple stages (e.g., REI/COR). In another embodiment, the Fin reveal process is a single-stage isotropic process. In yet another embodiment, the Fin reveal process is a single-stage, chemical oxide removal (COR) process (isotropic). As described earlier, utilization of isotropic-only etching/removal during the Fin reveal process is desirable to equalize the Fin heights when the substrate includes both SDB and DDB structures. This assists in matching Fin height more closely, and also provides smaller silicon recess, which provides a larger area/volume for the eventual formation of the S/D regions.

Figure 6D:
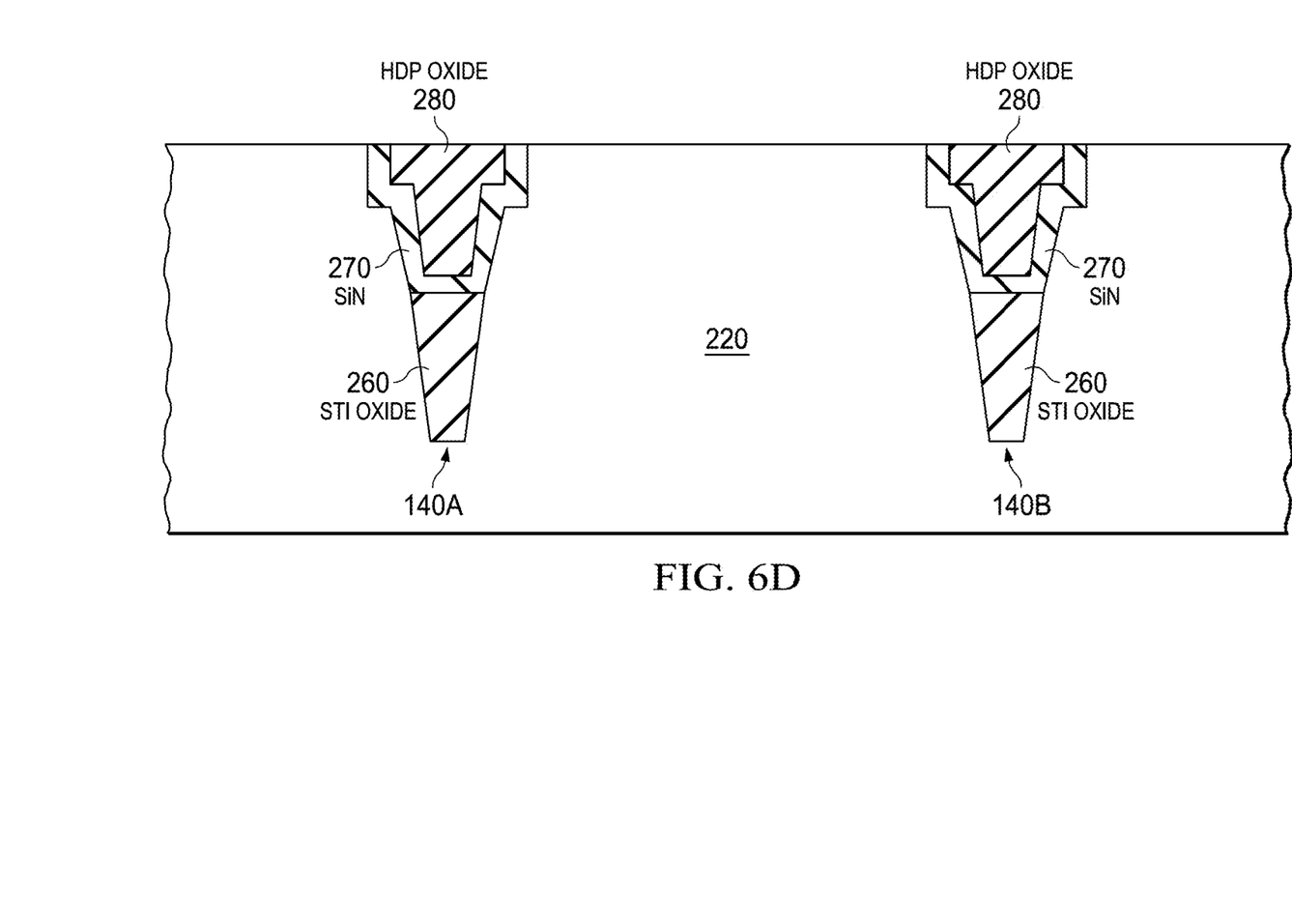

After these process(es), the surface of the oxide 280 is approximately coincident with the surface of the substrate 220, and another removal process occurs to remove the remaining layer 270—leaving the resulting structure as illustrated in FIG. 6D.

As will be appreciated, the STI oxide structure 260, the layer 270 thereabove, and the remaining portion of the oxide layer 280 together form the STI structures 140A, 140B.

Figure 7:
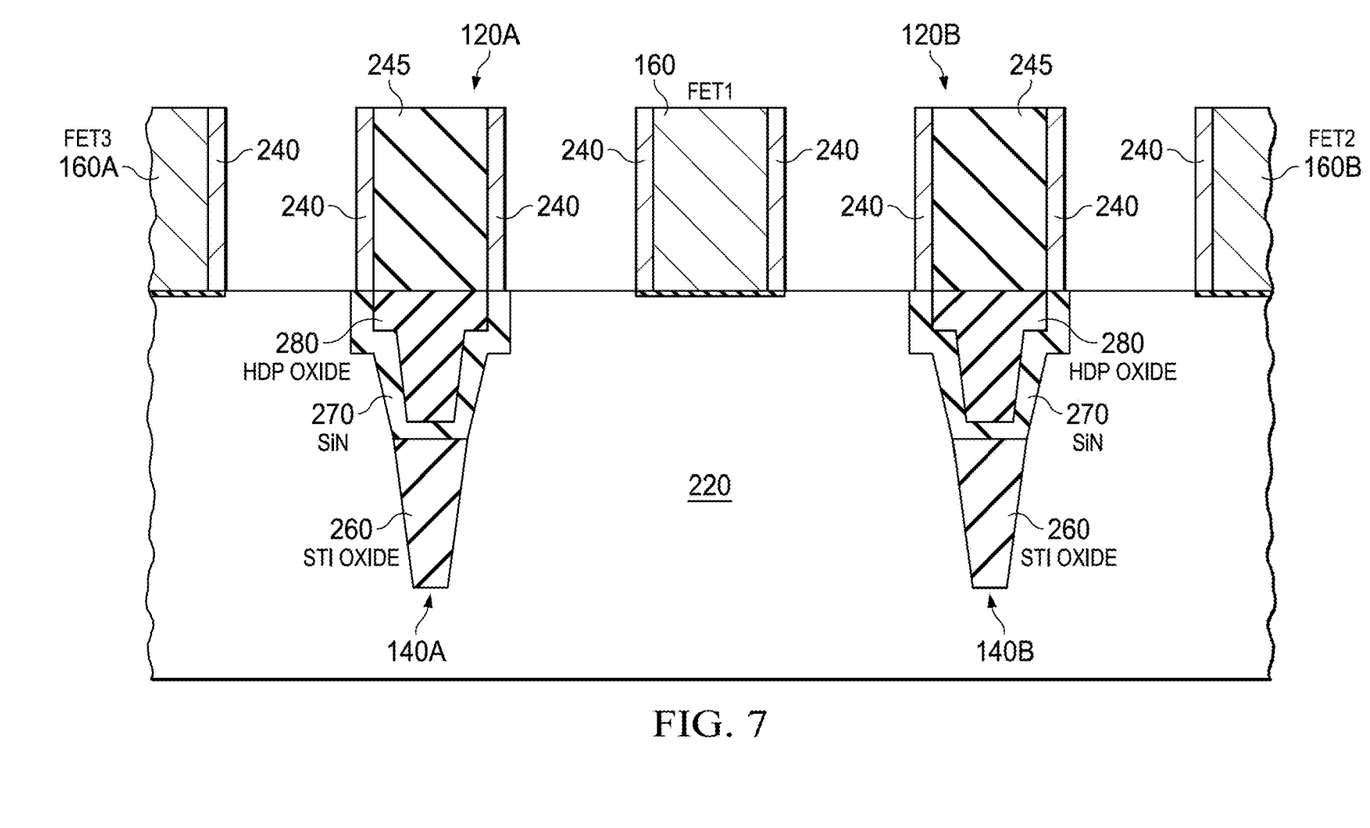

Now turning to FIG. 7, further processing of the structure shown in FIG. 6D includes forming the dummy gate structures 120A, 120B (or other structure(s)) above STI structures 140A, 140B. The active gate structures 160, 160A, 160B are also formed above the substrate 220, and as shown, the active gate structure is formed between the adjacent STI structures 140A and 140B. As will be appreciated, the structure shown in FIG. 7 undergoes further conventional processing to form the semiconductor device 100 (as shown in FIG. 2).

While FIGS. 3-7 show relevant steps in one embodiment of forming the various components of the device 100, additional conventional/typical semiconductor manufacturing processes generally follow (which are not described herein, and is unnecessary for the understanding of the teachings herein). Further, not all processing steps may be shown—only those relevant to the understanding of the present disclosure.

It will be understood that the present disclosure may be embodied in many different forms and should not be construed as limited to the exemplary embodiments set forth herein. Terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The terms "comprises" and/or "comprising", or "includes" and/or "including", when used in this specification, specify the presence of stated features, regions, structures, elements, and/or components, but do not preclude the presence or addition of one or more other of these. Reference throughout this specification to "one embodiment," "an embodiment," "embodiments," "exemplary embodiments," or similar language means that a particular feature, structure, or characteristic described in connection with the embodiment is included in at least one embodiment of the present disclosure.

If used, the terms "overlying" or "atop", "positioned on" or "positioned atop", "underlying", "beneath" or "below" mean that a first element, such as a first structure, e.g., a first layer, is present on a second element, such as a second structure, e.g., a second layer, wherein intervening elements, such as an interface structure, e.g. interface layer, may be present between the first element and the second element.

As used herein, "depositing" or "forming" may include any now known or later developed techniques appropriate for the material to be deposited or formed including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer 20 deposition (ALD), chemical oxidation, molecular beam epitaxy (MBE), plating, evaporation.

It will be understood that well known processes have not been described in detail and have been omitted for brevity. Although specific steps, structures and materials may have been described, the present disclosure may not limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of fabricating a semiconductor device for use with one or more field-effect transistor (FinFET) devices, the method comprising:

forming a shallow trench isolation (STI) structure within a semiconductor substrate from a shallow trench of first insulating material, comprising, forming a mask layer to selectively expose the first insulating material and adjacent portions of the semiconductor substrate, removing a first portion of the first insulating material and the substrate using the mask layer to form a first recess in the substrate having a first depth and expose vertical sidewall portions of the substrate, removing a second portion of the first insulating material using a chemical oxide removal process, thereby forming a second recess having a second depth wherein a third portion of the first insulating material remains, forming an inner spacer layer on the third portion of the first insulating material and along the exposed vertical sidewalls of the substrate, and forming a layer of second insulating material on the inner spacer layer and filling the first and second recesses with the second insulating material, thereby forming the STI structure comprising a lower portion of first insulating material and an upper portion of second insulating material separated by the inner spacer layer, and wherein portions of the inner spacer layer are disposed adjacent the vertical sidewall portions of the substrate; and after forming the STI structure, performing an isotropic Fin reveal process to reveal one or more fin structures.

2. The method in accordance with claim 1 wherein performing the isotropic Fin reveal process comprises:
performing a chemical oxide removal (COR) process.

3. The method in accordance with claim 1 wherein the inner spacer layer comprises nitride.

4. The method in accordance with claim 3 wherein inner spacer layer has a thickness between about 2 and 7 nanometers.

5. The method in accordance with claim 1 wherein the mask layer is formed of polysilicon.

6. The method in accordance with claim 1 wherein the portions of the inner spacer layer disposed adjacent the vertical sidewall portions of the substrate are, in the vertical direction, on the order of resulting Fin heights.

7. The method in accordance with claim 1 wherein the inner spacer layer has a thickness between about 2 and 7 nanometers.

8. The method in accordance with claim 7 wherein the portions of the inner spacer layer disposed adjacent the vertical sidewall portions of the substrate are, in the vertical direction, on the order of resulting Fin heights.

9. A method of fabricating a semiconductor device for use with one or more field-effect transistor (FET) devices, the method comprising:
forming a shallow trench isolation (STI) structure from a shallow trench of first insulating material disposed within a semiconductor substrate, comprising, forming a mask layer to selectively expose a surface of the first insulating material and surfaces of adjacent portions of the semiconductor substrate, selectively removing a first portion the exposed first insulating material and the exposed semiconductor substrate to a first depth, thereby exposing a second portion of the first insulating material and forming exposed vertical sidewalls in the semiconductor substrate, selectively removing another portion of the exposed second portion of first insulating material to a second depth, thereby exposing a third portion of the first insulating material, forming a spacer layer on the exposed third portion of insulating material and on the exposed vertical sidewalls of the semiconductor substrate, and forming a layer of second insulating material layer on the spacer layer;

forming a first field effect transistor (FET) on the substrate, the first FET having a gate structure, a first source/drain (S/D) region and a second S/D region, wherein the first S/D region is formed adjacent to the STI structure; and after forming the STI structure, performing an isotropic Fin reveal process to reveal one or more fin structures.

10. The method in accordance with claim 9 wherein performing the isotropic Fin reveal process comprises:
performing a chemical oxide removal (COR) process.

11. The method in accordance with claim 10 wherein the spacer layer comprises nitride.

12. The method in accordance with claim 9 wherein the spacer layer comprises nitride.

13. The method in accordance with claim 9 wherein spacer layer has a thickness between about 2 and 7 nanometers.

14. The method in accordance with claim 9 wherein the mask layer is formed of polysilicon.

* * * * *